(12) United States Patent
Schmitz et al.

(10) Patent No.: US 7,041,433 B1
(45) Date of Patent: May 9, 2006

(54) FLAT COIL AND LITHOGRAPHIC METHOD FOR PRODUCING MICROCOMPONENTS

(75) Inventors: Felix Schmitz, Mainz (DE); Matthias Nienhaus, Mainz (DE); Manfred Lacher, Bad Godesberg (DE)

(73) Assignee: Institut fur Mikrotechnik Mainz GmbH, Mainz (DE)

( * ) Notice: Subject to any disclaimer, the term of this patent is extended or adjusted under 35 U.S.C. 154(b) by 150 days.

(21) Appl. No.: 10/130,221

(22) PCT Filed: Nov. 17, 2000

(86) PCT No.: PCT/EP00/11447

§ 371 (c)(1),
(2), (4) Date: Aug. 5, 2002

(87) PCT Pub. No.: WO01/37045

PCT Pub. Date: May 25, 2001

(30) Foreign Application Priority Data

Nov. 19, 1999 (DE) ................................ 199 55 975

(51) Int. Cl.
*G03F 7/00* (2006.01)
(52) U.S. Cl. .................. 430/315; 430/311; 430/313; 430/320
(58) Field of Classification Search ................ 430/14, 430/311, 313, 315, 320
See application file for complete search history.

(56) References Cited

U.S. PATENT DOCUMENTS

| 5,149,397 A | 9/1992 | Bol | 216/41 |
| 5,190,637 A * | 3/1993 | Guckel | 205/118 |
| 5,646,464 A | 7/1997 | Sickafus | 310/254 |
| 5,877,924 A | 3/1999 | Saito | 360/126 |
| 6,131,880 A * | 10/2000 | Hahn et al. | 251/129.16 |

FOREIGN PATENT DOCUMENTS

| DE | 41 05 999 | 6/1992 |
| DE | 37 27 142 C2 | 2/1994 |
| DE | 44 00 315 | 1/1995 |
| DE | 44 32 725 C1 | 1/1996 |
| DE | 197 03 080 A1 | 7/1998 |

(Continued)

OTHER PUBLICATIONS

English translation of WO 96/08749, "Method for Producing A Three-Dimensional Component or Group of Components," M. Rothe et al., Mar. 1996.*

(Continued)

*Primary Examiner*—Nicole Barreca
(74) *Attorney, Agent, or Firm*—Hudak, Shunk & Farine Co., LPA

(57) ABSTRACT

The invention relates to a flat coil and to a lthographic method for producing microcomponents with metal component sources in the sub-millimeter range. According to the inventive method, a resist material is structured by means of selective exposition and removing the unexposed zones and filling in the gaps between the resist structures with metal by means of a galvanic method to produe the metal component structures. The aim of the invention is to improve such a method so that the microcomponents can be subdivided during said process. To this end, a structured three-dimensional sacrificial metal layer is produced during the production of the microcomponent, said sacrificial layer delimiting the microcomponent and being removed once the microcomponent is due to be subdivided. The invention also relates to a method for producing microcomponents with component structures of cross-linkable resist material and to a flat coil for micromotors with at least one coil layer with strip conductors in the sub-millimeter range.

14 Claims, 12 Drawing Sheets

FOREIGN PATENT DOCUMENTS

| | | |
|---|---|---|
| EP | 0 592 094 | 4/1994 |
| EP | 0 607 680 | 7/1994 |
| EP | 0 851 295 | 7/1998 |
| JP | 10-148644 | 2/1998 |
| WO | WO 96/08749 * | 3/1996 |

OTHER PUBLICATIONS

Proc. SPIE vol. 3680B-65 Paris, France, Mar. 30 through Apr. 1, 1999 "Micromachining and Microfabrication", title "Design and realization of a penny-shaped micromotor" by M. Nienhaus et al.

SU-8 Resistmaterial (Shell Chemical commercial name), which is a cross-linkable polymer that is described in J. Micromechanics, Microengineering 7(1997), pp. 121-124.

Japanese Abstract, No. 0008074099 AA, Published Mar. 19, 1996 "Structural Body Having Mechanical Element and Moving Part and Its Production".

* cited by examiner

FLAT COIL AND LITHOGRAPHIC METHOD FOR PRODUCING MICROCOMPONENTS

FIELD OF THE INVENTION

The invention concerns a lithographic method for producing microcomponents with metal component structures in the sub-millimeter range in which a resist material is structured by means of selective exposure and by removing the unexposed zones and filling in the gaps between the resist structures with metal by means of a galvanic method to produce the metal component structures. The invention also relates to a lithographic method for producing microcomponents with component structures of cross-linkable resist material in accordance with the preamble of claim 10 as well as a flat coil.

BACKGROUND OF THE INVENTION

Such lithographic methods are used for producing various metal microcomponents. These methods are of special importance for producing microcoils for electric micromotors. In order to increase the performance of micromotors on one hand and reduce the overall height on the other hand, these microcoils must have a large fill factor or a high structural density and small thickness. Furthermore, these microcomponents must be self-contained.

The known coils for micromotors do not meet these requirements.

DE 41 05 999 A1 describes a film coil that is used in a supra-conducting apparatus. These are layered film coils in which a printed circuit board is applied to an isolating substrate with the board being etched so that spiral-shaped printed circuit boards are produced. Possible materials that may be used are copper or aluminum. However, etching is disadvantageous in that the microstructures are undercut so that their aspect ratio that usually is around $\leq 1$ is significantly restricted. With the current technology only structures with relatively low heights may be produced. Typical heights for the thin conductor technology usually do not exceed 15 µm while the lower limit for the strip conductor width is around 50 µm with a minimum strip conductor distance of 60 µm. Due to the relatively large distances of the coil layers, the fill factor is relatively low as well.

From Proc. SPIE Vol. 3680B-65 Paris, France, Mar. 30 through Apr. 1, 1999 "Micromachining and Microfabrication", title "Design and realization of a penny-shaped micromotor" by M. Nienhaus et al. it is known to first apply a copper start layer on a substrate material with resist material being applied to the copper layer via a bonding layer. This resist material is structured by means of a mask and UV radiation and then the resist structures are filled with metal by means of a galvanic method. The resist material between the metal structures is removed so that only the metal structures are left. A coil produced in this manner is not self-contained and must be applied to a support foil together with additional coils.

The resist material used is SU-8 Resistmaterial (Shell Chemical commercial name), which is a cross-linkable polymer that is described in J. Micromechanics, Microengineering 7(1997), pp. 121–124, for example. It is an epoxy derivative of bisphenol-novolak that is already being used in the production of microstructures. This material above all is characterized in that it is possible to produce structures with high aspect ratios. Due to the cross-linking during the exposition the refraction index of this material changes so that structures with conductive properties are produced from the resist material. The exposition by means of masks therefore produces vertical walls that are maintained when the unexposed zones are etched away.

The known method requires that the SU-8-Resistmaterial be removed. However, the removal is extremely difficult because the material is cross-linked. It requires special solvents that, in principle however, only cause the resist material to swell up. Removal is only possible if the metal structures have a sufficiently large distance of typically >100 µm so that the solvent may develop its full potential between the metal structures. This means the structural density of microcomponents produced in this manner is very limited. Since the resist material also must be removed when the microcomponents are subdivided, this method is quite labor-intensive.

Microcomponents made of plastic, e.g. of SU-8, may be produced by means of lithographic methods in which first a negative metal mold is produced by means of galvanic molding, for example. This negative mold then is used as a molding tool for an injection molding process for producing the plastic micro-component. This method that is described in EP 0 851 295 A1, is very labor intensive due to the numerous individual process steps. Furthermore, the production of microcomponents with undercuts is not possible.

SUMMARY OF THE INVENTION

Therefore the object of the invention is to provide a method for producing microcomponents of metal or plastic material so that the microcomponents may be subdivided in the same process. Furthermore, the method is to produce self-contained microcomponents, especially flat coils for micromotors as well as microcomponents made of plastic with undercuts, and the method is to allow mass production. In addition, a stable flat coil for micromotors is to be produced.

This object, with regard to metal microcomponents, is achieved by means of a lithographic method in which during the production process of the micro-component a structured three-dimensional metal sacrificial layer is produced that delimits the microcomponent and in which the sacrificial layer is removed in order to subdivide the microcomponent.

This means that the microcomponent is embedded in the sacrificial material or between the sacrificial structures during the production process so that preferably only one side, for example the upper side, is exposed.

The three-dimensional structured sacrificial layer is advantageous in that the microcomponent not only is removed from the substrate during the removal process and in particular when the sacrificial layer is etched away, but that the outside profile of the microcomponent is exposed simultaneously and may be removed from the surrounding structure. This means that the subdivision only requires one process.

It is possible to use so-called cross-linkable negative resist material as well as photo-structurable epoxy resin and especially SU-8 material as resist material. It is possible to produce structures with a height of 700 µm by means of this method.

It also is possible to carry out the method with X-ray lithography in combination with positive and negative resist material. In this case PMMA is the preferred positive resist material and a negative resist material on novolak basis is used a negative resist material for X-radiation. Preferably the structured three-dimensional sacrificial layer is made of at least one horizontal sacrificial layer and at least one vertical sacrificial layer.

Preferably the structures for the vertical sacrificial layer are formed when the resist material is structured. This means that the structures for the vertical sacrificial layer may be exposed simultaneously with the selective exposition and the removal of the unexposed zones.

Here it is particularly advantageous if the same metal is used for the metal component structures and for the structured three-dimensional sacrificial layer. If, for example, the metal component structures are made of copper, copper is also used for the structured three-dimensional sacrificial layer.

The galvanic separation for forming the component structures and the galvanic separation for the vertical sacrificial layer preferably are carried out simultaneously. This means that no additional steps are necessary for producing the sacrificial layers which makes the method suitable for the mass production of microcomponents.

Preferably the resist material that surrounds the metal component structures is not removed. This makes the resist material part of the microcomponent and serves as a mechanical connecting and support structure. No additional measures for stabilizing the microcomponent, especially in the case of flat microcomponents, are necessary. A substrate on which the microcomponents are held and stabilized during the production process no longer is necessary. Since there is one substrate fewer, the overall height, especially in the case of flat coils, may be decreased considerably. In addition the microcomponents clearly are easier to handle.

Preferably strip conductors of a flat coil are produced as metal component structures. The self-contained flat coil is to be mounted or connected like a SMT component via bond pads. In this embodiment the resist material is not only used for stabilization purposes so that a self-contained coil may be produced but it is used simultaneously as an electric insulator between the strip conductors. In a preferred embodiment a completely embedded insulation is produced by the resist material that encloses the metal structures and the microcomponent like a kind of capsule.

Since the resist material cannot be removed, it is possible to produce strip conductors with a very high aspect ratio (>1), especially when SU-8 resist material is used, preferably up to an aspect ratio of 15 and above. This makes it possible, for example, to produce flat coils that only have one coil layer. Multi-layers that are required for customary flat coils no longer are necessary. This considerably lowers the production costs for such microcomponents. Preferably, however, two coil layers are preferred due to the connections of the strip conductors.

The object, with regard to components with component structures made of cross-linkable resist material, is attained in that a) a horizontal metal sacrificial layer is applied to a substrate;
b) a resist material is applied to the sacrificial layer;
c) the component structures are made of the resist material by means of selective exposition and removal of the non-exposed zones;
d) the gaps between the component structures are filled with metal by means of a galvanic method to produce at least one vertical sacrificial layer; and
e) the microcomponents are subdivided by removing the sacrificial layers.

Since it is not necessary to produce metal component structures in this method, the structuring of the resist material does not produce the negative structure but rather the positive structure of the component. Due to the fact that the gaps between the component structures made of resist material are made of the same metal that can be etched away, for example, and that these component structures already are applied to a sacrificial layer, the component/s may be exposed by removing the overall structured three-dimensional sacrificial layer. In this method the microcomponents are embedded in the structured three-dimensional sacrificial layer, too, so that only one step is necessary for the subdividing process.

Preferably steps b) through d) are carried out in this order at least twice. This is especially advantageous if components with undercuts in vertical direction are to be produced.

If the microcomponent is not immediately used for its intended purpose and must be stored and transported first, it is advantageous if at least one connecting vane of resist material is produced when the vertical sacrificial layer is produced with said vane interrupting the sacrificial layer. The microcomponent may be kept and transported with the structure that surrounds the microcomponent by means of said connecting vane or said connecting vanes.

Here it is advantageous if during the production of the microcomponent a magazine structure is produced of resist material that holds the microcomponent via the at least one connecting vane.

Preferably at least two microcomponents are simultaneously produced in such a magazine structure. Depending on the size of the microcomponents, it is possible to produce more than 100 microcomponents simultaneously in such a magazine structure so that mass production is possible.

Preferably a wafer made of this resist material is used as the magazine structure in which the microcomponents are arranged and held via the connecting vanes. Due to its larger size the wafer is easy to handle and the microcomponents are protected within the wafer. When the microcomponents are needed, they may be picked up via a suction gripper, for example, and removed from the wafer. The connecting vanes break easily due to their preferably low thickness of only a few micrometers.

The flat coil for micromotors is characterized in that the strip conductors are embedded in non-conducting resist material.

Preferably resist material is used that is structurable and cross-linkable by means of UV radiation.

Preferably the strip conductors are connected to a metal connecting surface (bond pad) that extends from the resist material. This means the flat coils may be used like SMT components (surface mounted components). This metal connecting surface provides the only metal contact because the flat coil preferably is completely surrounded by resist material. The flat coil therefore has an encapsulated design.

Due to the fact that it is possible to achieve a high aspect ratio and a high degree of structural density with the method according to the invention, a high fill factor may be achieved with the production of flat coils. The width of the resist material between the individual strip conductors ranges between 5 and 15 μm, preferably around 10 μm, and the height ranges around 40 to 80 μm, preferably around 60 μm. This means the insulation may be reduced to a minimum which would correspond to an insulation layer of approximately 5 μm when the wires are insulated.

In addition to the metal structures that comprise the microcomponent, such as the strip conductors of a flat coil, it is possible to simultaneously produce additional metal structures that would provide reinforcements along the inside and outside edge of the flat coil, for example, and thus would provide a brace for the microcomponent or form a fitting. Thus a flat coil may be placed on a shaft which further increases the stability and the precision of the component position in the specified system.

Such reinforcements may also be used for microcomponents made of resist material. This may be done, for example, by producing sacrificial structures in the microcomponent that are omitted when removing the sacrificial structure during the subdividing process.

Exemplary embodiments of the invention with reference to drawings are explained in the following paragraphs.

DETAILED DESCRIPTION OF THE INVENTION

Figure 1:
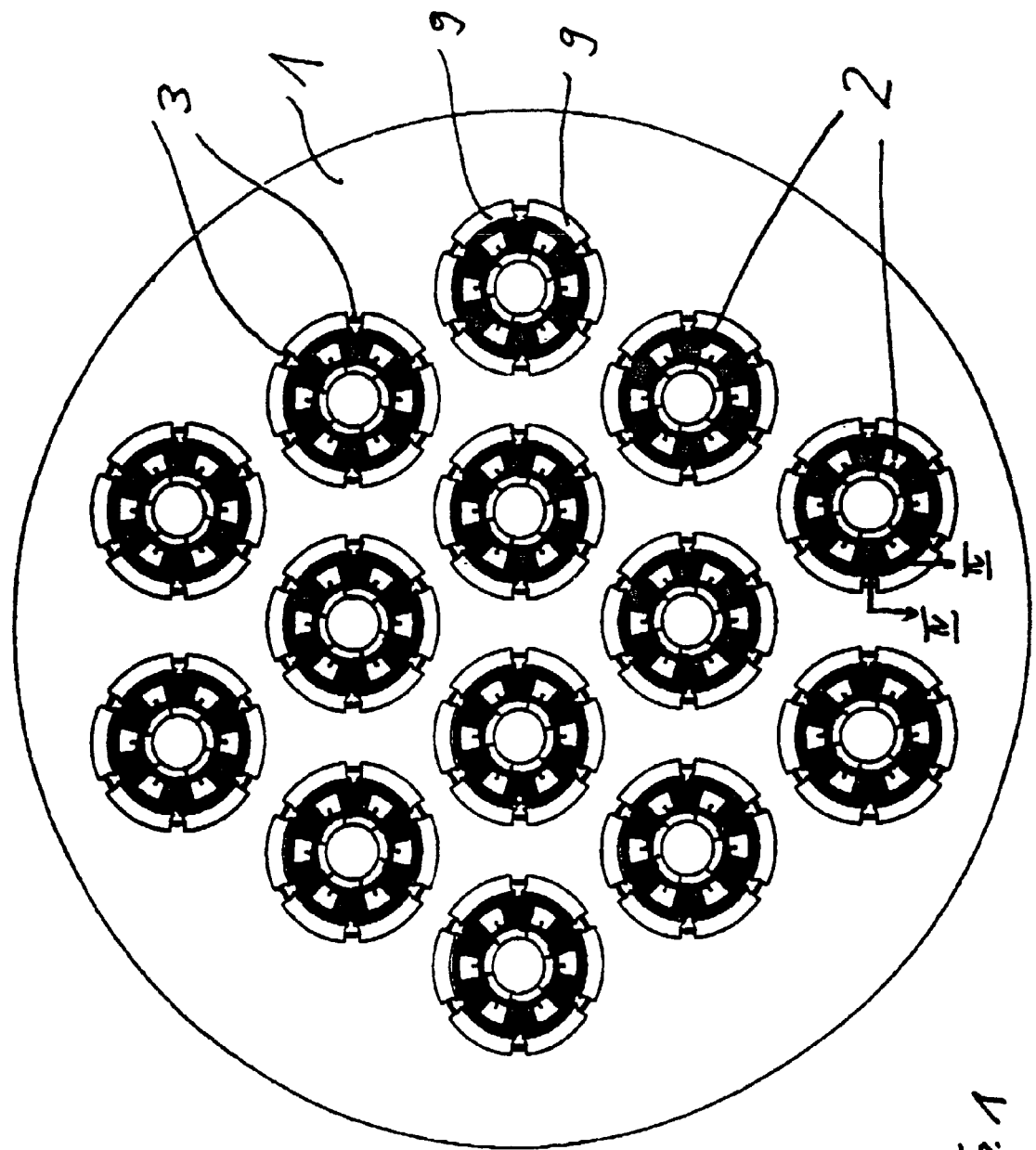
FIG. 1 a top-view of a wafer with several flat coils for micromotors.

FIG. 1 shows a wafer 1 made of resist material as a magazine structure in which a number of round flat coils 2 are arranged that are connected to the wafer material via connecting vanes 3. Between the connecting vanes 3, the coil 2 and the wafer 1 are arc-shaped gaps 9 that are the result of the removal of the vertical sacrificial layer that will be explained later on. All coils 2 including the wafer 1 were produced simultaneously.

Figure 2:
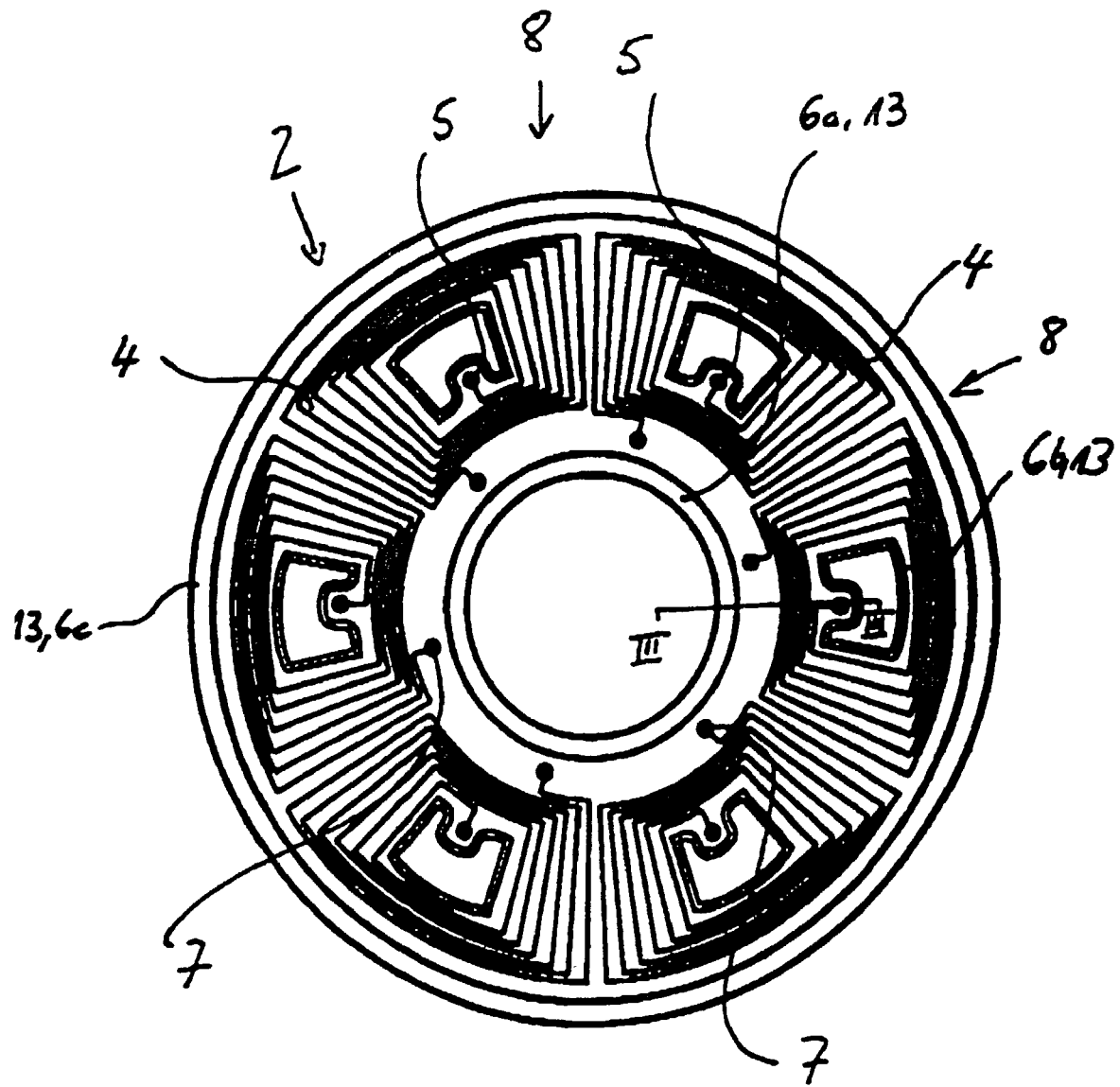
FIG. 2 a top-view of such a flat coil.
Figure 4A:
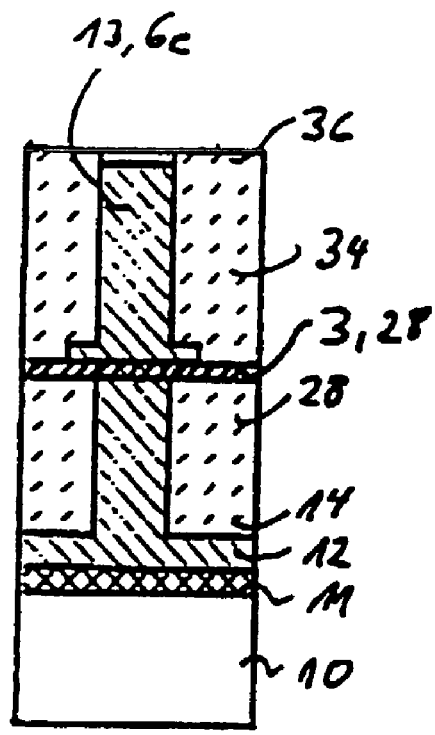
FIG. 4a+4b a partial cross-section to show the connecting vanes.

FIG. 2 shows the enlarged top-view of a coil 2 that has several coil layers 8 comprising strip conductors 4. On the inside these coil layers 8 are connected via so-called connecting pads 5 and throughplatings 7 for coil layers that are arranged below or above. Furthermore, the vertical sacrificial layers 13 are shown that are not yet removed in FIG. 2. The surrounding magazine structure is not shown and the connecting vanes 3 cannot be seen. On the inside of the coil a subdividing ring 6a in form of a metal ring is shown as vertical sacrificial layer 13. Subdividing ring 6b inside the coil layers 8 as well as a subdividing ring 6c that surrounds the entire coil 2 are shown. The connecting vanes 3 are not visible because they are located inside the subdividing ring 6c, as is shown in FIG. 4a. After these subdividing rings 6a, b, and c are etched away, the coil 2 is available for further use.

Figure 3A:
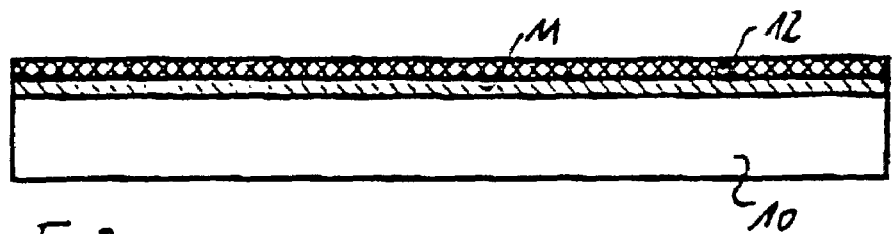
FIGS. 3a–3q cross-sections of a coil section to explain the production process of a flat coil with two coil layers.
Figure 3B:
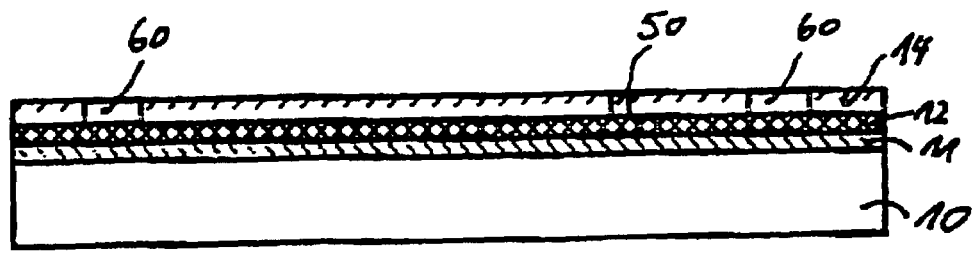
Figure 3C:
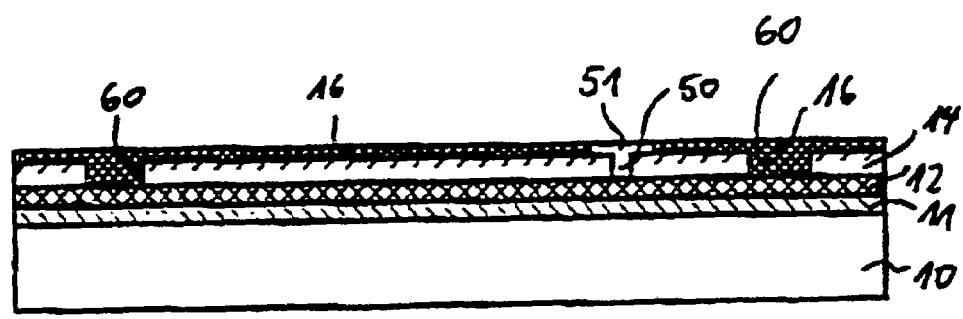
Figure 3D:
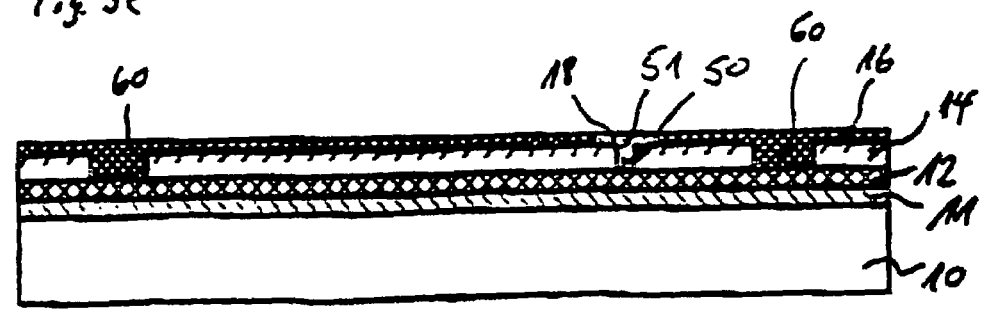
Figure 3E:
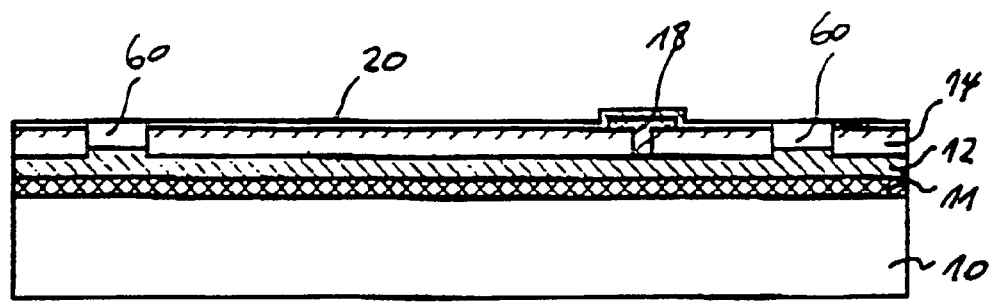
Figure 3F:
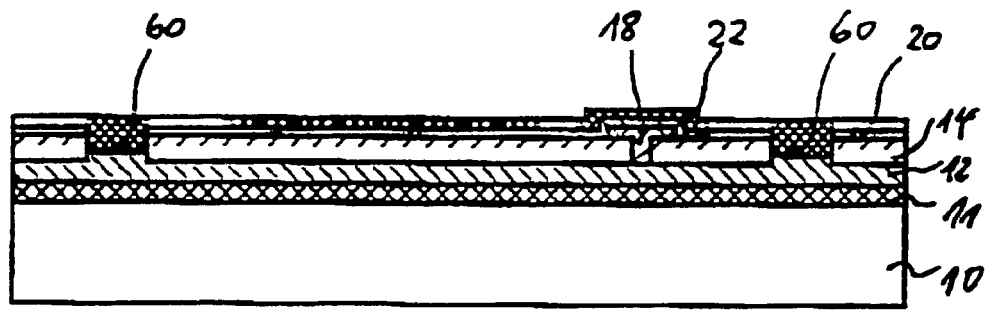
Figure 3G:
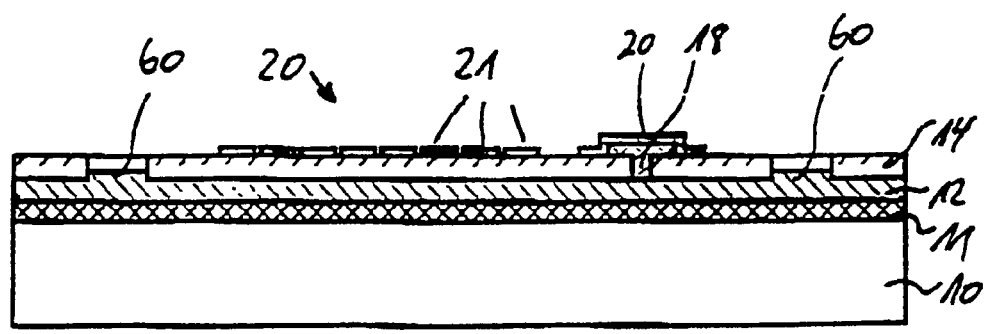
Figure 3H:
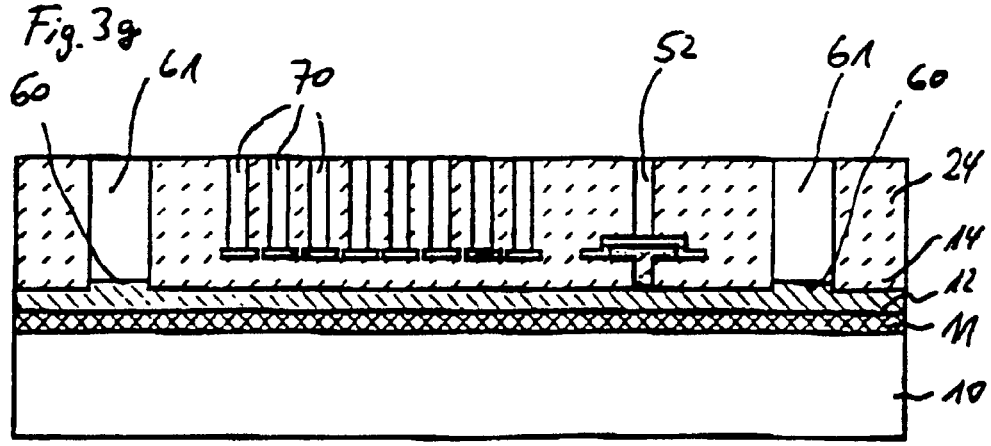
Figure 3I:
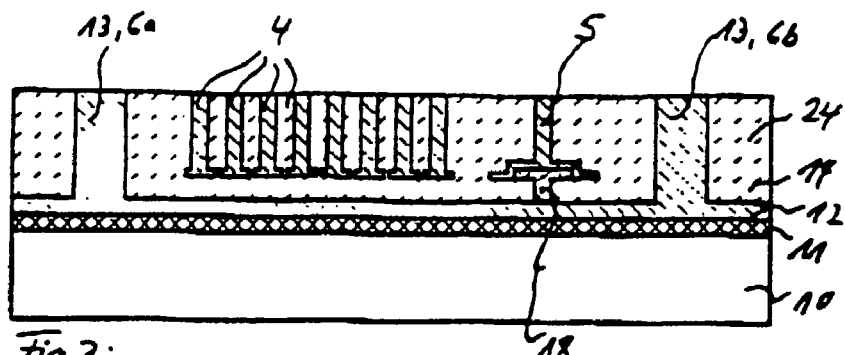
Figure 3J:
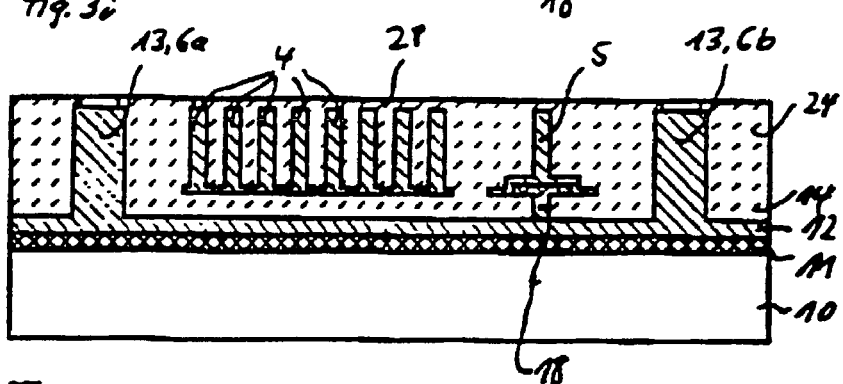
Figure 3K:
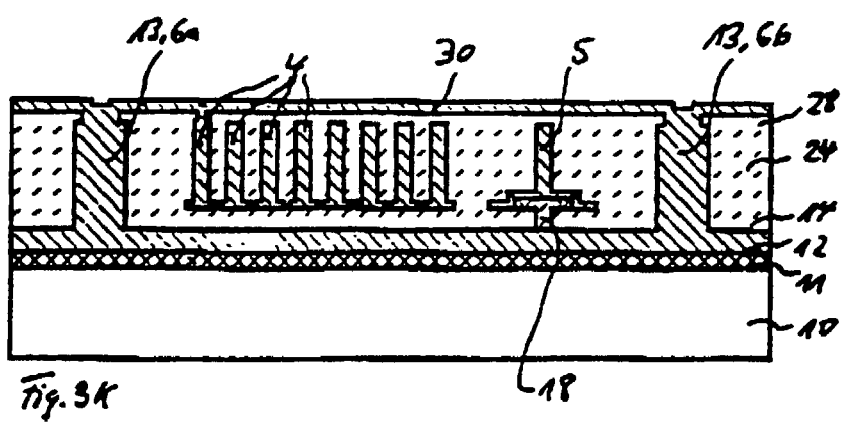
Figure 3L:
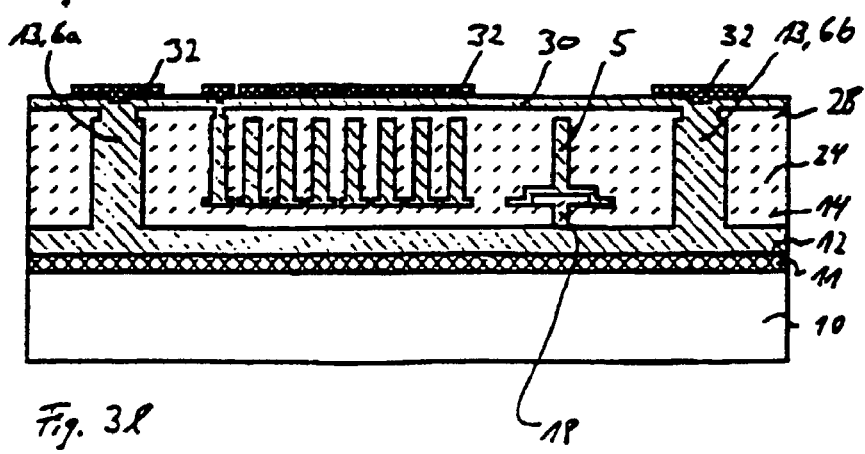
Figure 3M:
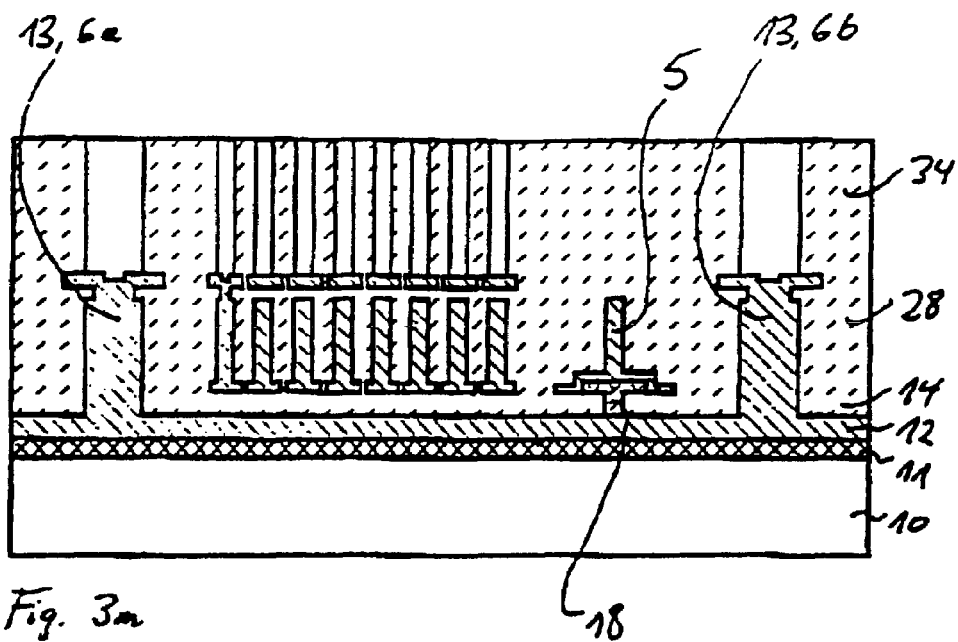
Figure 3N:
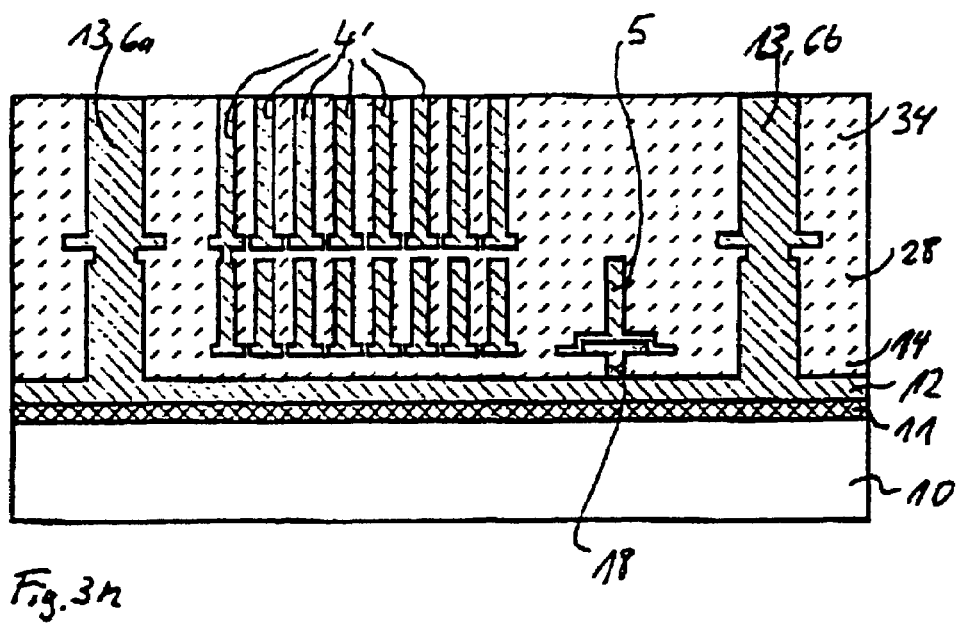
Figure 3O:
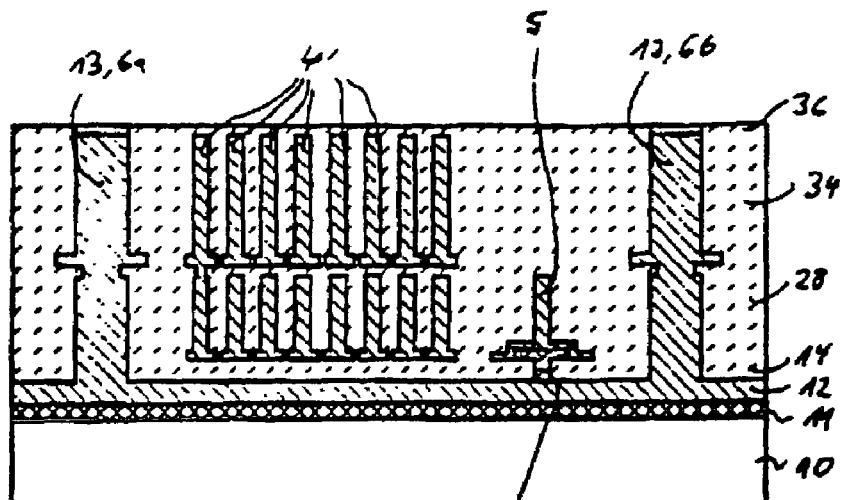
Figure 3P:
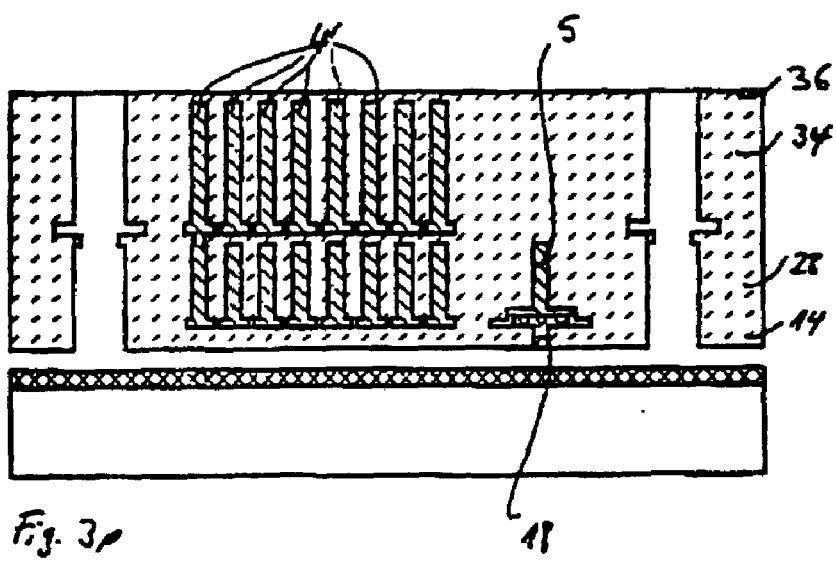
Figure 3Q:
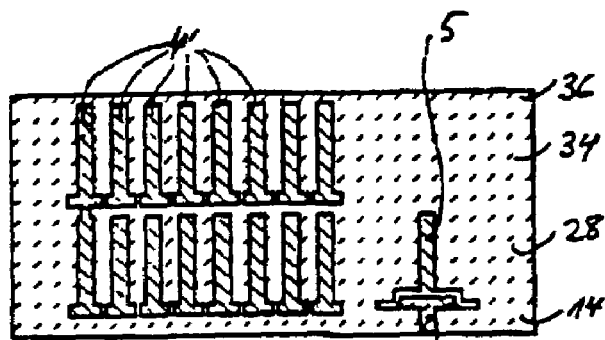

FIGS. 3a–3q explain in more detail the production process of such a coil 2 that comprises two coil layers. The coil section along line III—III FIG. 2 was selected for the example. Starting with a substrate 10 that may be comprised of silicone, first a start layer 11 of titanium and then a horizontal sacrificial layer 12 of copper are applied. The thickness of the sacrificial layer 12 is 1 μm.

Then an adhesive layer, made of polyimide, for example, and then a first resist layer 14 of SU-8 material with a thickness of 20 μm is applied to the sacrificial layer 12. Using a known method and by means of a mask and UV exposition this first resist layer 14 is structured so that a connecting structure 50 and two subdividing structures 60 are formed.

In the next step shown in FIG. 3c a first photosensitive resist layer 16 with a thickness of approx. 2.2 μm is applied to the coil base of the first resist layer 14 that is produced in this manner, with the photosensitive resist layer being structured in the area of the already created connecting structure 50 (connecting structure 51). In another step shown in FIG. 3d an etch stop is galvanically separated. This etch stop material that is identified with reference character 18, preferably is nickel. This etch stop material 18 is necessary so that the subsequently applied electric conducting material is not removed when the sacrificial layer 12 is etched away in the area of the connection.

In FIG. 3e the photosensitive resist layer 16 has been removed and a first galvanic start layer 20 made of copper is applied. This also increases the layer thickness of the copper material in the subdividing structures 60.

In the next step (FIG. 3f) the start layer 20, by means of a second photosensitive resist layer 22, is structured so as to make the start areas 21 for the subsequent strip conductor structures. These start areas 21 are somewhat wider than the subsequent strip conductor structures (ref. FIG. 3g) which advantageously is due to the fact that the mask must not be positioned quite as accurately for the structuring of the subsequent layers so that the subsequent component structures must not be placed exactly onto these start areas.

Following this structuring a second resist layer 24 made of SU-8-material—as is shown in FIG. 3h —is applied. This layer 24 is structured just like the resist layer 14 so that the coil structures 70 and the continuation of the subdividing structures 60 (subdividing structure 61) as well as the connecting structures 50, 51 (connecting structure 52) are formed.

In the next step these structures are filled with metal by means of a galvanic method so that the result is the structure shown in FIG. 3I. By filling these resist structures, the subdividing rings 6a and 6b, the connecting path 5 and the strip conductors 4 are formed. At this point the coil would be finished, however, it is possible, as is shown in FIGS. 3j–3q to apply another coil layer. To this end a third resist layer 28 is applied which in turn is structured and covered with a second galvanic start layer 30.

The coating and structuring processes by means of the third photosensitive resist layer 32, fourth resist layer 34 and fifth resist layer 36 according to FIGS. 3l–3o correspond to the previously described structuring and coating processes.

As may be seen in FIGS. 3i through 3o, the vertical sacrificial layers 13 extend in the form of the subdividing rings 6a–6b from the horizontal sacrificial layer 12 vertically upward across both coil layers.

In FIG. 3p the sacrificial layers 12, 13 are removed so that coil 2 may be subdivided. In FIG. 3q the subdivided coil or the corresponding section of the separated coil respectively is shown.

Figure 4B:
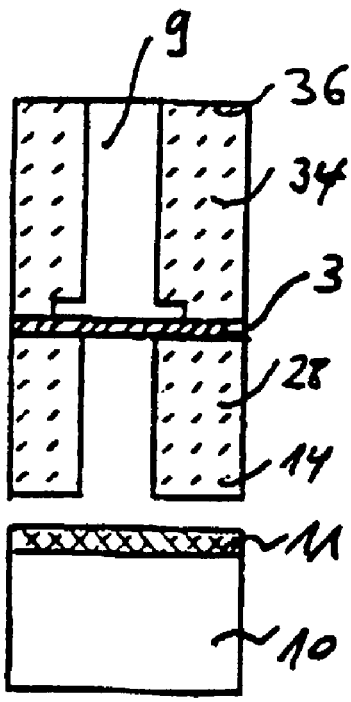

FIGS. 4a and 4b show a section along line IV—IV of the coil 2 shown in FIG. 1. The vertical sacrificial layer 13 in the form of the subdividing ring 6c is interrupted by layer 28 in a smaller circumference section that forms one of typically several connecting vanes 3. Since the layer thickness of layer 28 is only a few micrometers, there only is this connecting vane 3 after the vertical sacrificial layer 13 is removed with said connecting vane breaking when the coil is picked up and removed.

Figure 5:
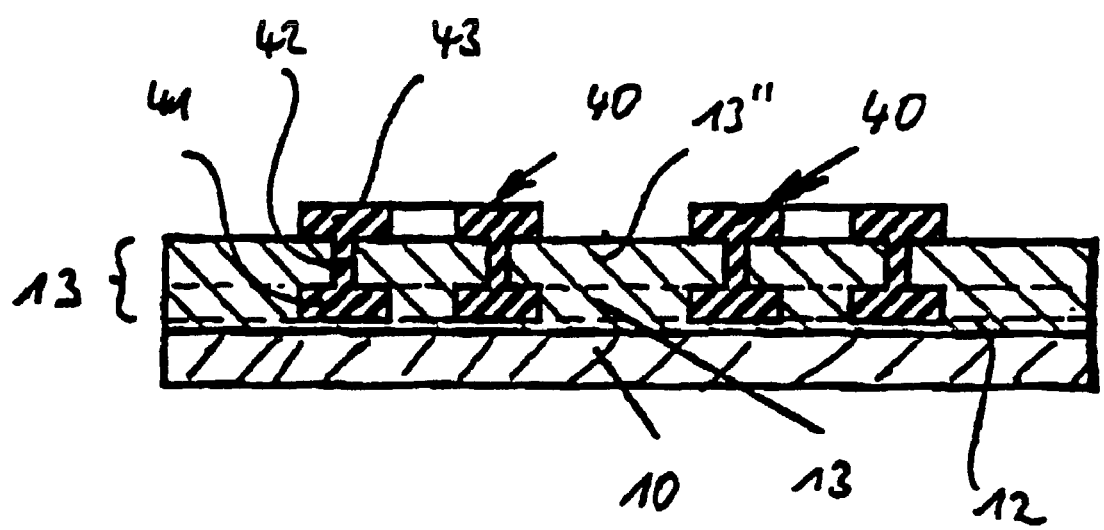
FIG. 5 a cross-section to explain the production of a microcomponent made of resist material and FIGS. 6a–6f cross-sections to explain another embodiment of the production of microcoils.

FIG. 5 shows the production of two microrings 40 made of cross-linkable resist material. First a horizontal sacrificial layer 12 is applied to a substrate 10. Since the microrings have undercuts in vertical direction due to their H-shaped cross-section, a total of three resist layers with the corresponding structures must be applied. This also requires the application of two partial sacrificial layers 13' and 13", which together form the vertical sacrificial layer 13. In order to produce the two resist/sacrificial layers that are applied to the horizontal sacrificial layer 12, steps b) through d) according to claim 10 must be carried out twice in a row. After removing the structured three-dimensional sacrificial layers 12, 13, the individual microrings 40 are present.

FIGS. 6a through 6f show the production of microcoils according to one modified method.

First a start layer 11 made of titanium is applied to a substrate 10 that may be made of silicone and then a horizontal sacrificial layer 12 made of copper with a thickness of preferably 1 μm is applied (FIG. 6a), which corresponds to FIG. 3a up to this point. Then an adhesive layer 17, for example made of polyimide, is applied to the sacrificial layer 12.

Figure 6A:
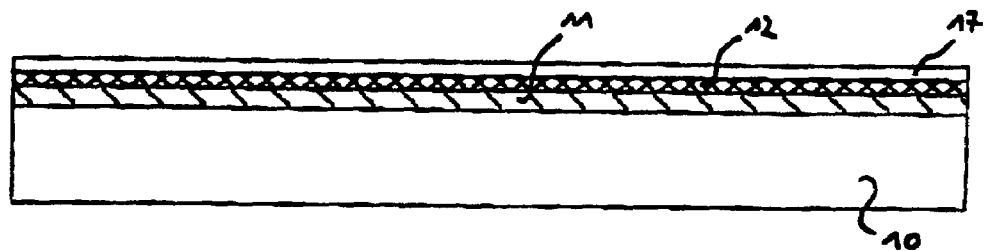
Figure 6B:
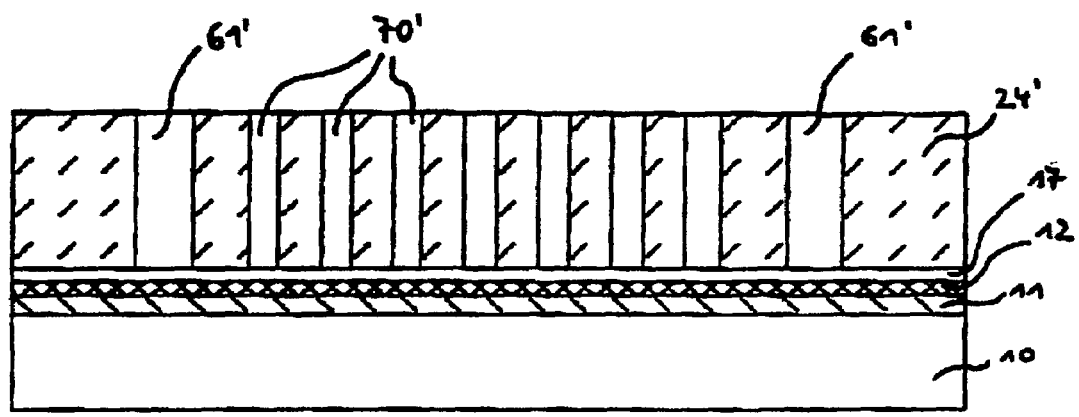

Using a known method, a resist layer 24' made of SU8-material [sic] is applied to this polyimide layer 17 according to FIG. 6b. This layer then is structured by means of a mask and UV exposition so that the coil structures 70' and the subdividing structures 61' are produced.

Figure 6C:
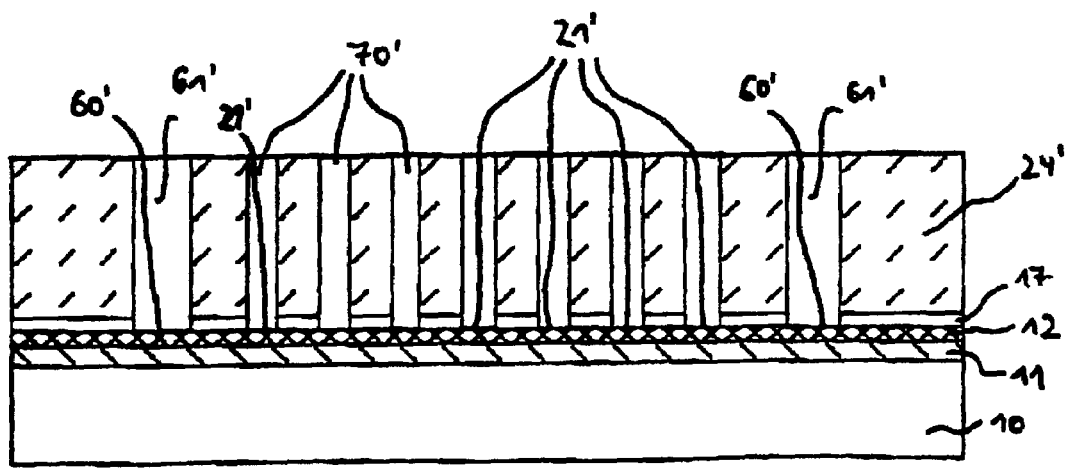

In the next step the adhesive layer, e.g. made of polyimide, is etched away from the coil structures 70' and the subdividing structures 61' so that the horizontal sacrificial layer of copper may be used as start areas 21' or 60' for the strip conductors 4 and vertical sacrificial layers that are to be formed (FIG. 6c).

Then the coil structures 70' and subdividing structures 61' simultaneously are filled with metal so that the strip conductors 4 and vertical sacrificial layers 13 or the subdividing rings 6a and 6b are formed.

Figure 6D:
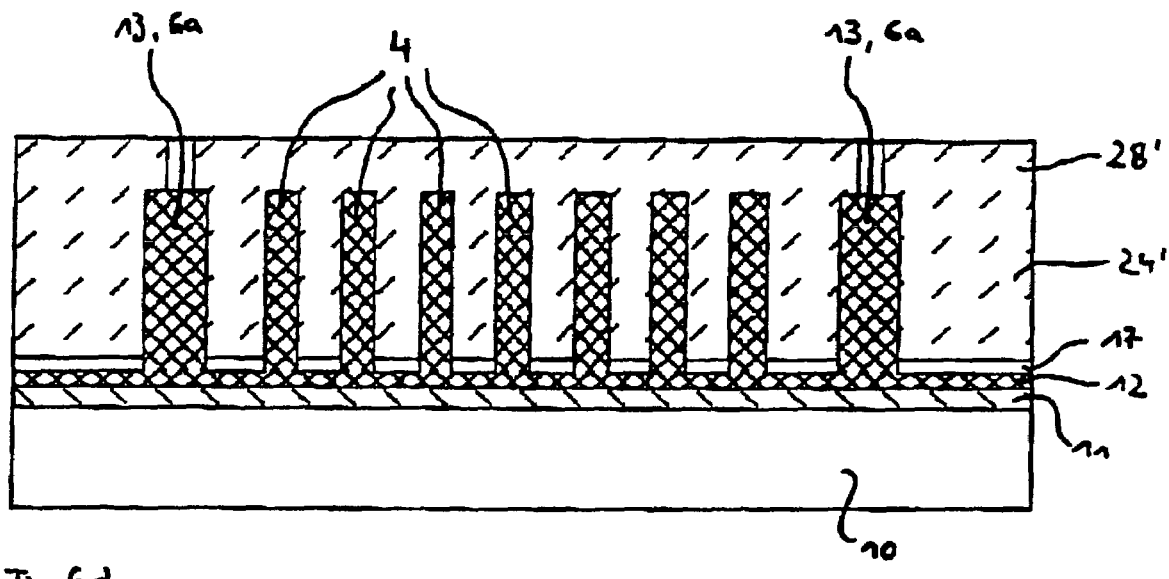

Then a second horizontal resist layer 28' is applied to embed the coil structures 70'. This resist layer 28' is structured in the areas of the subdividing structures 61" in order to expose the vertical sacrificial layers 13 or the subdividing rings 6a and 6b (FIG. 6d).

Figure 6E:
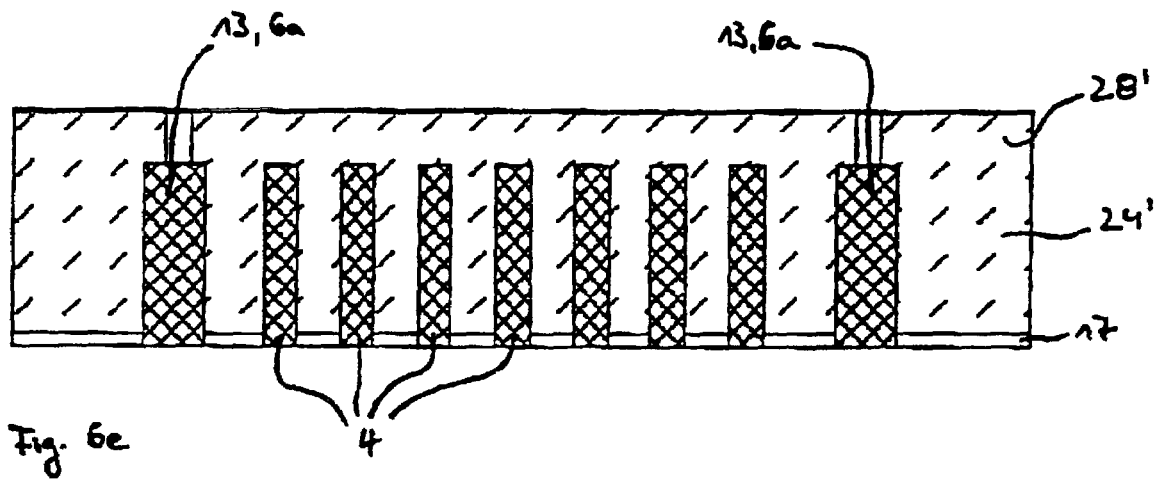

Then, for producing the single-layer coil, the carrier 10, the start layer 11 made of titanium and the horizontal sacrificial layer 12 made of copper in another step all are removed by preferably etching away these layers (FIG. 6e).

This ensures that the vertical sacrificial layer fixes the microcomponents in the magazine structure so that microcomponents are not only held by the connecting vanes during transport, for example. In order to subdivide the microcomponents, especially single-layer coils, the vertical sacrificial layers 13 or subdividing rings 6a and 6b and the connecting vanes made of resist material are removed.

In accordance with a second embodiment the vertical sacrificial layers 13 or subdividing rings 6a and 6b that are exposed via the structuring in the area of the subdividing structures 61' are etched away with the vertical sacrificial layer 13 being removed first and the horizontal sacrificial layer 12 made of cooper, the start layer 11 made of titanium and the substrate 10 being removed as well. This ensures that the microcomponents, in particular the single-layer coils, are only fixed via connecting vanes in the magazine structure.

Figure 6F:
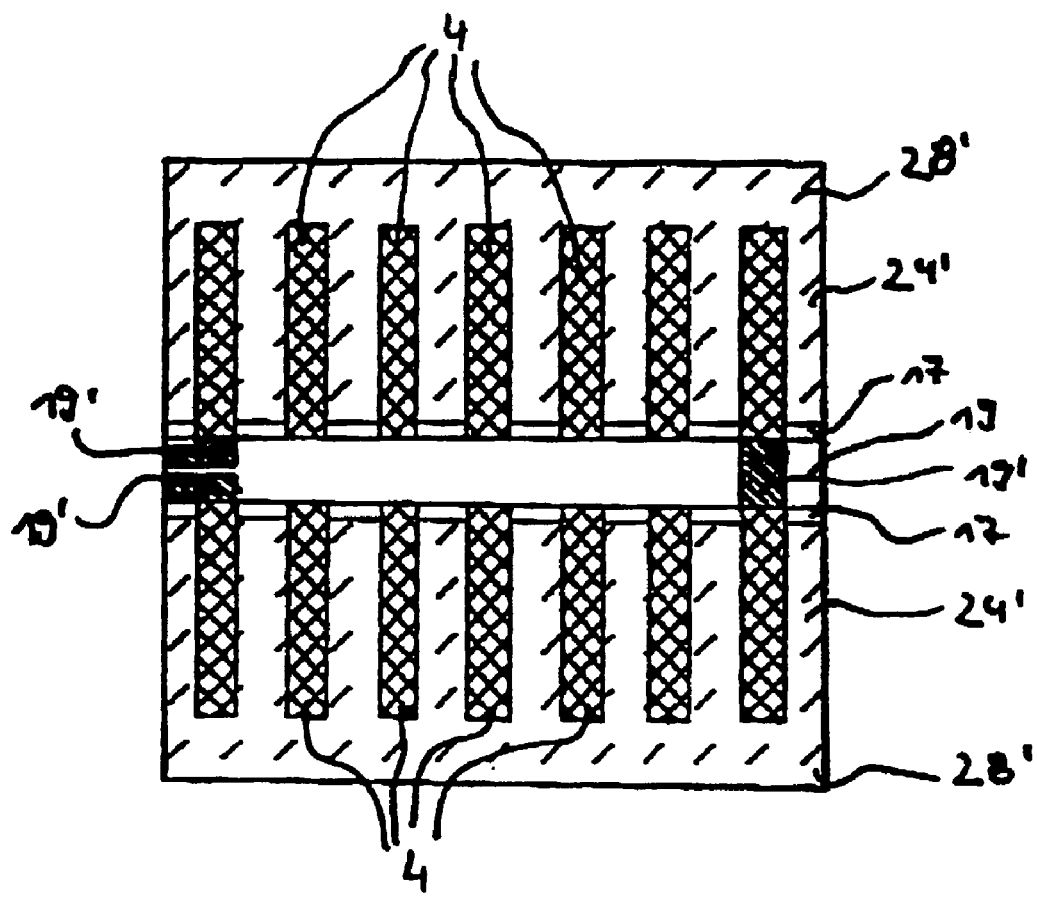

In order to produce a two-layer coil, the single-layer coils are removed from the magazine structure and two single-layer coils that are produced based on the method described above, are combined into a two-layer microcoil especially by gluing them onto a contact foil 19. The contact foil has corresponding contact surfaces 19' that then are in contact with the coil structures 4 (FIG. 6f).

REFERENCE CHARACTERS 1 wafer
2 coil
3 connecting vane
4 strip conductor
5 Connecting path
6a,b,c subdividing ring
7 throughplating
8 coil layer
9 gap
10 substrate
11 titanium layer
12 horizontal sacrificial layer
13 vertical sacrificial layer
13' partial layer
13" partial layer
14 first resist layer
16 first photosensitive resist layer
17 adhesive layer
18 etch stop material
19 contact foil
19' contact surface
20 first galvanic start layer
21 start surface
22 second photosensitive resist layer
24 second resist layer
28 third resist layer
30 second galvanic start layer
32 third photosensitive resist layer
34 fourth resist layer
36 fifth resist layer
40 microring
41 lower ring section
42 center ring section
43 upper ring section
50 connecting structure
51 connecting structure
52 connecting structure
60 subdividing structure
61 subdividing structure
70 coil structure

What is claimed is:

1. A lithographic method for producing microcomponents with metal component structures in the sub-millimeter range, comprising the steps of:
   structuring a resist material by means of selective exposure; and
   removing the unexposed zones and filling the gaps between the resist structures with metal by means of a galvanic method to produce the metal component structures wherein a structured three-dimensional sacrificial metal layer is produced during the production of the microcomponent, wherein the structured three-dimensional sacrificial layer is comprised of at least one horizontal sacrificial layer and at least one vertical sacrificial layer which form subdividing structures and wherein all sacrificial layers consist of the same metal, said sacrificial layer delimiting the microcomponent, wherein the same metal is used for the metal component structures and the structured three-dimensional sacrificial layer and said sacrificial layer being removed to subdivide the microcomponent.

2. A method according to claim 1, wherein the structures for the vertical sacrificial layer are produced during the structuring of the resist material.

3. A method according to claim 1, wherein the galvanic separation for producing the component structures and the galvanic separation for the vertical sacrificial layer are carried out simultaneously.

4. A method according to claim 1, wherein the resist material that surrounds the metal component structures is not removed.

5. A method according to claim 1, wherein strip conductors of flat coils are produced as metal component structures.

6. A method according to claim 5, wherein structured start layers are used for the subsequent galvanic separation to produce the strip conductors.

7. A method according to claim 5, wherein the strip conductors are produced with an aspect ratio of >1.

8. A method according to claim 7, wherein the strip conductors are produced with an aspect ratio of >1 to about 15.

9. A method according to claim 1, wherein at least one connecting vane is produced of resist material during the production of the vertical sacrificial layer with said connecting vane interrupting the sacrificial layer.

10. A method according to claim 1, wherein a magazine structure made of resist material is produced during the production of the microcomponent with said magazine structure holding the microcomponent via said at least one connecting vane.

11. A method according to claim 1, wherein at least two microcomponents are produced simultaneously in one magazine structure.

12. A method according to claim 1, wherein a wafer is produced as the magazine structure.

13. A lithographic method for producing microcomponents with component structures of cross-linkable resist material, comprising the steps of:
   a) applying a horizontal, metal sacrificial layer to a substrate,
   b) applying resist material to the sacrificial layer,
   c) producing component structures from the resist material by means of selective exposure and removing the unexposed zones,
   d) filling the gaps between the component structures with metal by means of a galvanic method to produce at least one vertical sacrificial layer and
   e) removing the sacrificial layers to subdivide the microcomponent.

14. A method according to claim 13, wherein steps b) through d) are carried out at least twice in this order.

* * * * *